(12) United States Patent
Tsai

(10) Patent No.: US 7,804,164 B2
(45) Date of Patent: Sep. 28, 2010

(54) SUBMINIATURE ELECTRONIC DEVICE HAVING HERMETIC CAVITY AND METHOD OF MANUFACTURING THE SAME

(75) Inventor: Chon-Ming Tsai, Taipei (TW)

(73) Assignee: Besdon Technology Corporation, Taipei (TW)

( * ) Notice: Subject to any disclaimer, the term of this patent is extended or adjusted under 35 U.S.C. 154(b) by 447 days.

(21) Appl. No.: 11/802,695

(22) Filed: May 24, 2007

(65) Prior Publication Data
US 2008/0191336 A1 Aug. 14, 2008

(30) Foreign Application Priority Data
Feb. 14, 2007 (TW) .............................. 96105421 A

(51) Int. Cl.
*H01L 23/20* (2006.01)
(52) U.S. Cl. ................ 257/682; 257/704; 257/E23.002
(58) Field of Classification Search ................ 257/682, 257/704, E23.002, E23.138, E23.188, E23.192, 257/E23.194, E21.5, E21.501
See application file for complete search history.

(56) References Cited

U.S. PATENT DOCUMENTS

| 6,929,974 B2 * | 8/2005 | Ding et al. .................. 438/106 |
| 7,045,868 B2 * | 5/2006 | Ding et al. .................. 257/414 |

* cited by examiner

*Primary Examiner*—Roy K Potter
(74) *Attorney, Agent, or Firm*—Winston Hsu

(57) ABSTRACT

The invention discloses a subminiature electronic device with a hermetic cavity and method of manufacturing the same. It particularly relates to a chip type or chip scale packaged electronic device produced in substrate level. Firstly, a sacrificial layer is coated onto each of the identical microstructures disposed on a large substrate. A protective layer containing glass powders is then applied to encapsulate the sacrificial layer. Afterwards, the sacrificial layer is removed so as to form a cavity between the microstructure and the protective layer. The whole protective layer is then melted at elevated temperature to seal the cavity in an environment of specific gas. Finally, the large substrate is diced into a plurality of individual devices with a hermetic cavity over the microstructure. The applicable fields include micro-electronic circuits, micro-vibration systems, micro electrical-mechanical systems (MEMS), and gas discharge apparatuses.

16 Claims, 10 Drawing Sheets

SUBMINIATURE ELECTRONIC DEVICE HAVING HERMETIC CAVITY AND METHOD OF MANUFACTURING THE SAME

BACKGROUND OF THE INVENTION

1. Field of the Invention

The invention relates to a subminiature electronic device that is mounted directly onto the surface of circuit boards. The invention generally relates to the package of a subminiature device having a sealed cavity over microstructure that is disposed on a substrate. Further, the cavity can be hermetically sealed to enclose a specific gas inside. More particularly, the invention discloses a chip scale packaged device having a hermetic cavity that is fabricated in the substrate level at inexpensive cost.

2. Description of the Prior Art

A hermetic cavity plays an important role in electronic devices by providing a sealed free space over microstructure and enclosing a specific gas inside. Therefore, the microstructure can be operated in a safe and stable environment because air and other gases in the surrounding atmosphere are isolated from the cavity.

The application of hermetic cavities can be roughly classified into four categories. The first category is highly reliable microcircuits and optoelectronics such as the integrated circuits for aviation and military purposes. The hermetic cavity protects electronic circuits from probable corrosion and damage of moisture, oxidation, and mechanical impact. The second category is micro-vibration devices such as oscillators and surface acoustic wave (SAW) filters, which have at least a micro-vibrator on the surface of substrates. A free space must be provided over the micro-vibrator so that the micro-vibrator can be operated functionally. Because the micro-vibrator is very sensitive to moisture and oxidation, a hermetic cavity is required then.

The third category is micro electrical-mechanical devices that usually include swinging or moving elements fabricated from silicon substrates, such as micro-cantilever beams and membranes. It is highly preferred that a hermetic cavity is provided so that the elements can be operated precisely and stably. The fourth category is gas discharge devices such as plasma displays, over-voltage protectors and so on. A hermetic cavity filled with specific discharge gas is required to enable discharge across two separated electrodes at the predetermined voltage.

Polymeric materials are widely used in the electronic industry such as epoxy, polyimide, and silicone, but they cannot hermetically seal the gas. In contrast, metals, glasses, and ceramic materials are able to hermetically seal the gas inside a cavity because of their dense structure. Ceramic materials are suitable for structures such as base, base plate and top cap because of their high melting temperatures. Sealing material usually consists of metals of low-melting temperature or glasses. Tin/gold alloy is a popular metal of low melting temperature that melts at around 350 to 400° C. Glasses melt at somewhat higher temperature, around 400 to 600° C.

To meet miniaturization requirements of final products and systems, electronic devices keep shrinking sizes to be surface-mounted onto circuit boards. FIG. 1A shows a first example of conventional subminiature electronic devices equipped with a hermetic cavity. The example includes a base 13, a chip 11, a lid 18, a cavity 17, an adhesive layer 23, sealing material 28, terminals 22, metallic traces 24, and bonding wires 26.

Base 13 is a rectangular or square body with a cavity that opens on the top surface. The base 13 is made of electrically insulating alumina of more than 90% purity by multi-layer firing at high temperature. Multiple metallic traces 24 are patterned inside the base 13 to connect with corresponding multiple terminals 22 disposed on the bottom surface of the base 13. A metallic film is plated on the top surface of the base 13 to promote adhesion to the sealing material 28.

Chip 11 consists of a substrate and microstructures formed on the top surface of the substrate. The microstructures include micro-electronic circuits, micro-vibration structures, and micro electrical-mechanical structures. Chip 11 is bonded to base 13 by an adhesive layer 23. Bonding wires 26 are extremely tiny metallic wires made of gold or aluminum with a diameter of 25 to 50 microns. Bonding wires 26 electrically connect the microstructures of chip 11 to terminals 22 via the metallic traces 24. Terminals 22 are contact pads when the device is mounted onto circuit boards.

Lid 18 is usually made of metallic plate with gold plating on the surfaces. Sealing material 28 is a metal of low-melting temperature that is usually attached to the lid 18 along its perimeter in a preformed width. Lid 18 together with sealing material 28 is precisely assembled onto the top surface of the base 13 one by one. The entire structure is then placed into a furnace to melt the sealing material 28 and hermetically seal the cavity 17 in the environment of Nitrogen or other specific gases as required.

FIG. 1B illustrates a second example of conventional subminiature electronic device with a hermetic cavity. This example is based on a planar substrate 21 that is topped with microstructures 12. A ceramic cap 19 has a cavity 17 that opens on the bottom surface. Sealing material 25, made of glass with a melting temperature of 400 to 600° C., is applied onto the bottom surface of the cap 19 along its perimeter to hermetically seal the cavity 17. Termination pads 16 electrically connect the microstructures 12 to the end portions of substrate 21. Terminals 14 are contact pads when the device is mounted onto circuit boards.

The device depicted in FIG. 1B can be a chip-type over-voltage protector by gas discharge techniques. Substrate 21 is temperature-resistant and electrically insulating that is normally made of alumina of 96% purity in the rectangular shape. Microstructures 12 are generally two discharge electrodes separated by a tiny gap, wherein one of the discharge electrodes is connected with the circuits to be protected while the other one is connected to the ground. Over-voltage is discharged to the ground across the tiny gap by means of a specific gas enclosed inside the cavity 17.

Two metallic termination pads 16 electrically connect with the two discharge electrodes 12 respectively. The termination pads 16 are usually wider than discharge electrodes 12. The material and thickness of termination pads 16 can be the same as or different from those of the discharge electrodes 12. Two conductive terminals 14 are formed on the side surface of the two opposing ends of the substrate 21 and connect with the discharge electrodes 12 via the two termination pads 16. The terminals 14 are contact pads when the subminiature electronic device is mounted onto circuit boards.

The manufacturing method is to deposit discharge electrodes 12 and termination pads 16 on the top surface of substrate 21. Separately, sealing material 25 is applied onto the bottom surface of the cap 19 along its perimeter. Cap 19 together with sealing material 25 is precisely assembled onto the substrate 21 one by one. The entire structure is then placed into a furnace to melt the sealing material 25 and hermetically seal the cavity 17 in the environment of specific gas. Nowadays, the smallest size of the device is 2.0×1.3 mm (length× width) In the industry according to the structure of this example.

FIG. 1C illustrates a third example of conventional subminiature electronic device with a hermetic cavity, which has the smallest outline in the industry nowadays. It's a chip scale package because the area of the device is just a little bit larger than that of the chip. The device can be a surface acoustic wave (SAW) filter for wireless communication products such as mobile phones that have tight space requirement. The device includes a base plate 15, a chip 11, a cavity 17, metallic traces 24, terminals 22, bonding conductors 30, sealing material 28, and filler 29.

Base plate 15 is generally made of electrically insulating alumina of more than 90% purity by multi-layer firing at high temperature. Multiple metallic traces 24 are patterned inside the base plate 15 to connect with corresponding multiple terminals 22 disposed on the bottom surface of base plate 15.

Chip 11 consists of a piezoelectric substrate and microstructures of vibrators and other microcircuits are formed on the top surface of the substrate. Chip 11 is bonded to the base plate 15 by the flip chip technique so that the top surface faces the base plate 15. Bonding conductors 30, made of gold balls or silver/tin alloy balls, connect the microstructure of chip 11 to terminals 22 via the metallic traces 24 by thermal-sonic means. Therefore, a small gap is defined between the surface of chip 11 and the base plate 15. Sealing material 28, made of a metal of low-melting temperature, is applied onto the surface of chip 11 along its perimeters and melted by heating to hermetically seal the cavity 17.

Terminal 22 are contact pads when the device is mounted onto circuit boards. Filler 29 is polymeric material that covers the bottom surface and side surfaces of the chip 11 to form an outline having same length and width as base plate 15. The smallest size of the device is 1.4×1.1 mm (length×width) in the industry nowadays according to the structure of this example. However, the fabricating cost by flip chip is very expensive because the dimension of chip 11 is extremely small and fine.

The manufacturing method starts from providing a large substrate having disposed multiple base plates 15. Chip 11 is then picked, placed, and bonded to the base plate 15 one by one via bonding conductor 30 by the flip chip technique. Afterwards, the entire structure is placed into a furnace to melt the sealing material 28 and hermetically seal the cavity 17 in the environment of specific gas. The filler 29 is applied to cover the bottom surface and side surfaces of chip 11 to fill up the spaces between two adjacent chips 11. Finally, individual device is separated from the large substrate by dicing of a diamond blade or laser The described examples of conventional subminiature electronic device with a hermetic cavity have been employed in the industry for many years. But, the material cost is high, particularly the gold-containing material such as sealing material, lid, bonding wires, and bonding conductors. Also, the fabricating cost is high because of the low productivity that the lid and base, or the cap and substrate must be precisely assembled one by one. The fabricating cost is particularly high for a chip scale package by the flip chip technique, wherein the chip is bonded to base plate one by one too. As the device becomes smaller, the conventional assembly technique becomes very challenging to result in much higher fabricating cost.

Bonding a large substrate to another one is a probable solution to reduce the fabricating cost, wherein a large substrate may contain multiple chips, lid, caps, bases or base plates. After the two large substrates complete bonding, individual devices are separated from the large substrate by dicing of a diamond blade, laser or other suitable means. However, bonding two large substrates is very difficult because of thermal mismatch of the two large substrates after melting the sealing material at high temperature unless the material, thickness, and geometry of the two large substrates are exactly the same. Besides, the large substrate containing caps, bases, and base plates is usually made of ceramic material fired at a temperature more than 1000° C. so that the dimensions can not be precisely controlled. The larger the substrate, the more serious the problem will be.

So, the scope of the invention is to provide a subminiature electronic device and the manufacturing method of the same to solve above described problems.

SUMMARY OF THE INVENTION

A scope of the present invention is to provide a subminiature electronic device with a sealed cavity and its manufacturing method at less cost. A large substrate having formed a plurality of identical microstructures is provided and a sacrificial layer comprising polymer is coated onto each of the microstructures. A protective layer containing glass powders is then applied to encapsulate the sacrificial layer. Afterwards, the sacrificial layer is removed so as to form a cavity between the microstructure and the protective layer. The whole protective layer is melted at elevated temperature to hermetically seal the cavity after cooling.

Finally, terminals are formed to connect with the microstructures and individual devices are separated from the large substrate by precise dicing of a diamond blade or laser A large substrate may contain hundreds or even thousands of devices fabricated simultaneously. Contrary to conventional devices, fabricating cost of the inventive device will be very competitive as the device becomes smaller because more devices can be accommodated in a large substrate.

The protective layer is homogeneous material comprising glass that substitutes sealing material and lid, sealing material and cap, or sealing material and base plate of the described examples of conventional devices. From another viewpoint, the present invention extends the scope of sealing material to replace the function of cap, lid, or base plate. Therefore, the present invention is more concisely constructed so that the material cost is reduced and the manufacturing method becomes simplified too.

Another scope of the present invention is to provide a subminiature electronic device with a sealed cavity that is smaller in size. Because the protective layer comprising glass is directly disposed over the microstructures, precise assembly between lid and base, cap and substrate, or chip and base plate of conventional devices is no longer required. So, the dimension tolerance required for assembly is substantially reduced. Furthermore, the length and width of the packaged device can be made as small as those of the chip. Therefore, a chip scale packaged device is accomplished in a large substrate level. The present invention exhibits significant advantages over the conventional devices in the chip scale package because the costly flip chip assembly technique is not required anymore.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1A:
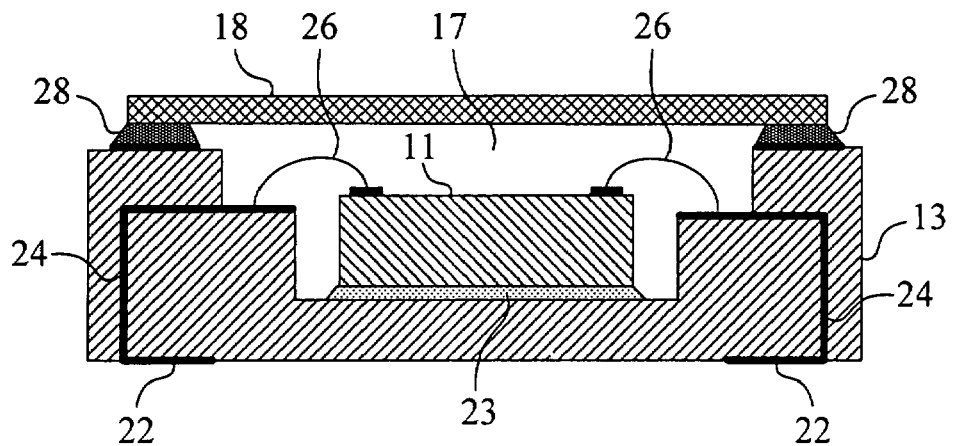
FIG. 1A is a cross-sectional view of a first example of conventional subminiature electronic device with a hermetic cavity.
Figure 1B:
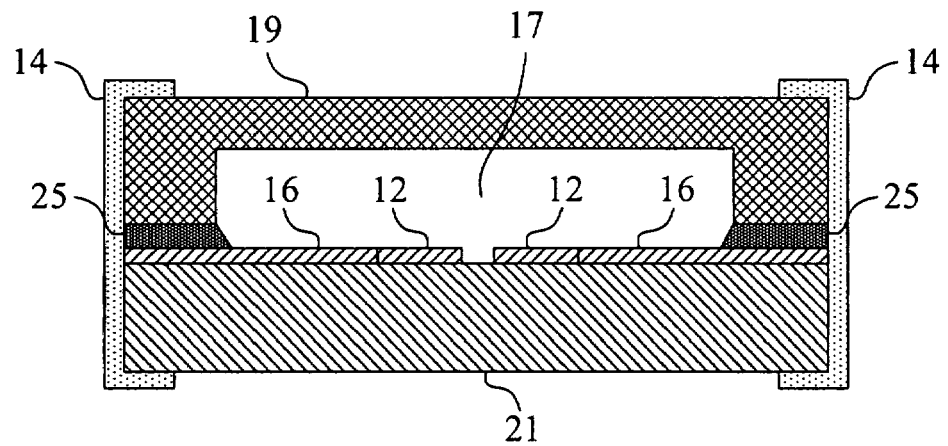
FIG. 1B is a cross-sectional view of a second example of conventional subminiature electronic device with a hermetic cavity.
Figure 1C:
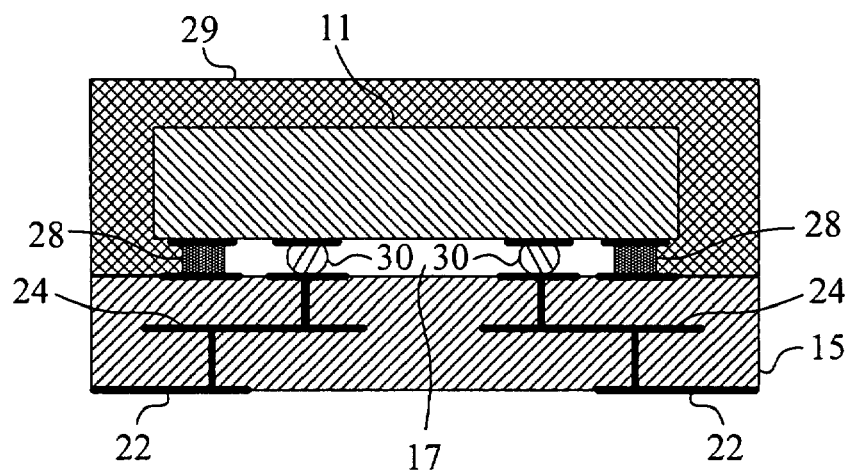
FIG. 1C is a cross-sectional view of a third example of conventional subminiature electronic device with a hermetic cavity.
Figure 2:
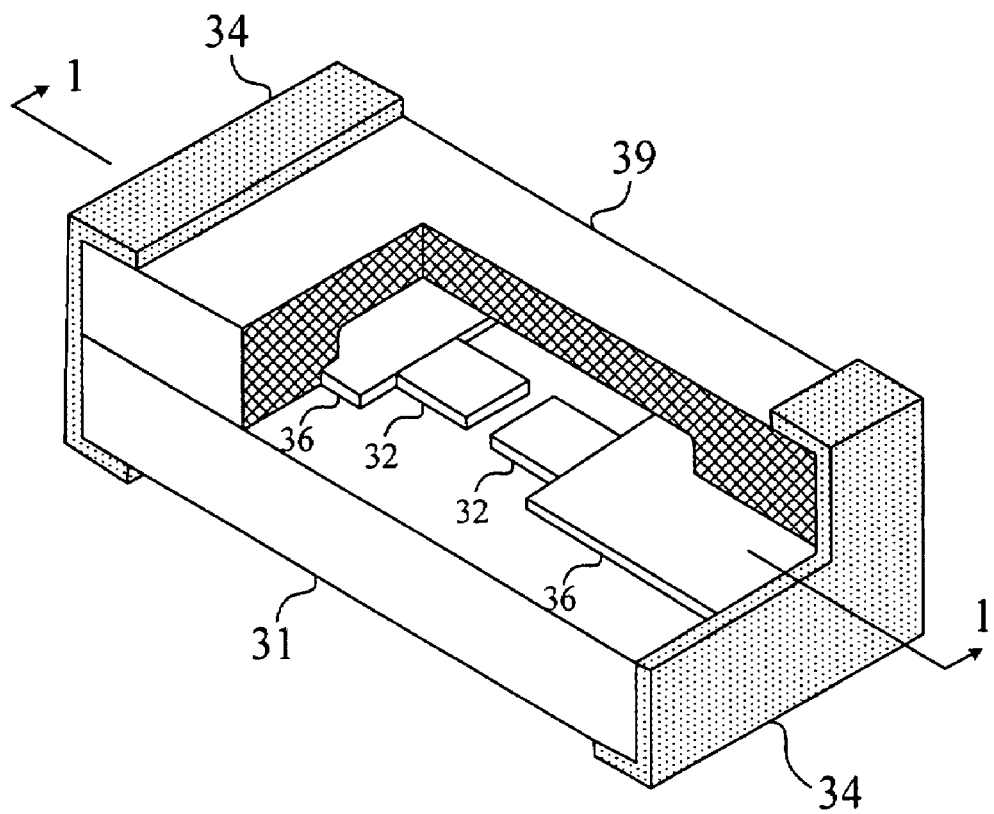
FIG. 2 is a perspective view of a subminiature electronic device according to a preferred embodiment of the present invention with two terminals.
Figure 3:
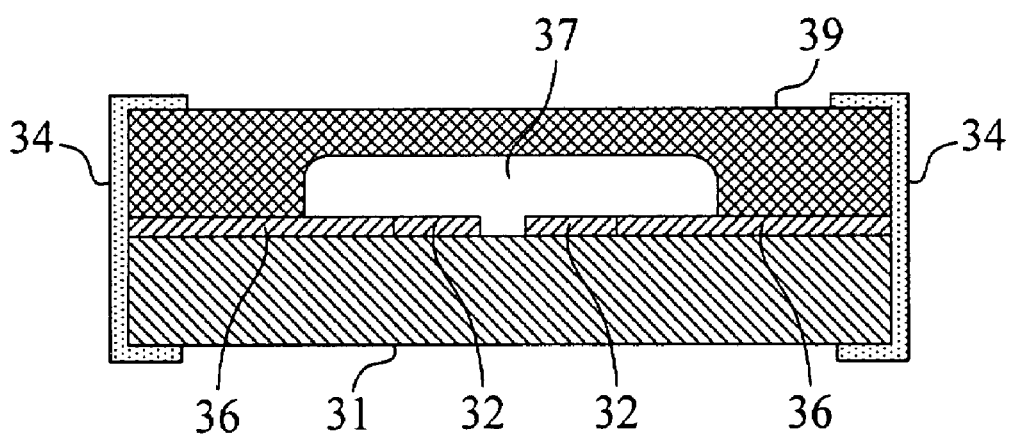
FIG. 3 is a cross-sectional view of FIG. 2.

FIG. 2 and FIG. 3 illustrate a preferred embodiment of the present invention with two terminals. The device can be a chip-type over-voltage protector by gas discharge techniques. FIG. 2 is a perspective view wherein protective layer 39 is partially removed to reveal the internal structure. FIG. 3 is a cross-sectional view of FIG. 2 along the centerline of width (1-1 line). The device comprises a substrate 31, a protective layer 39, a cavity 37, two discharge electrodes 32, two termination pads 36, and two terminals 34.

The substrate 31 is electrically insulating and is made of alumina of more than 90% purity, glass, or other ceramics. Alumina of 96% purity is widely used with a thickness of 0.2 to 1.0 mm.

The microstructure includes two discharge electrodes 32 disposed on the top surface of substrate 31 and separated by a tiny gap, wherein one of the discharge electrodes connects with the circuits to be protected while the other one connects with the ground. Over-voltage is discharged to the ground across the tiny gap by means of a specific gas enclosed inside the cavity 37. Discharge electrodes 32 consist of metals or conductive oxides such as titanium, silver, gold, platinum, titanium nitride (TiN), ruthenium dioxide ($RuO_2$), and barium aluminum alloy (BaAl), or a combination of two or more such materials.

Discharge electrodes 32 are often deposited by thin film techniques such as sputtering and evaporation or thick film printing. Width of the tiny gap between the two discharge electrodes 32 is around 10 to 100 microns, which is very small so as to reduce the response time of gas discharge. The tiny gap can be formed by means of chemical etching, laser dicing, or diamond blade dicing. For diamond blade dicing, the blade is preferred to dice into the substrate 31 so as to isolate the discharge electrodes 32. But, such practice will wear away the blade very quickly since the substrate 31 is generally made of hard material such as alumina. It's highly preferred that a softer adhesion layer comprising glass is interposed between the substrate 31 and the discharge electrodes 32 to ensure a long blade life.

Two metallic termination pads 36 electrically connect with the two discharge electrodes 32 respectively. The termination pads 36 are usually wider than the discharge electrodes 32 and preferably have low resistance. The material and thickness of the termination pads 36 can be the same as or different from those of the discharge electrodes 32. In addition to connecting discharge electrodes 32 to terminal 34, the termination pads 36 also serve as the second discharge electrodes. It's known that the discharge electrodes 32 will be damaged by multiple discharge of high current because the gap between them is very tiny. A feasible solution is to let discharge electrodes 32 have suitable resistance so that the voltage across the termination pads 36 will increase as current increases. After the current goes over the specified limit, the induced voltage will enable current discharge across the termination pads 36. Therefore, the discharge electrodes 32 are only subjected to the discharge of small current, and the imposed damage is substantially reduced.

Protective layer 39 comprises glass with a melting temperature between 400 to 600° C. preferably. The protective layer 39 is applied over the discharge electrodes 32 and adheres to the substrate 31, directly or via termination pad 36, around the discharge electrodes 32 to seal the cavity 37. The cavity 37 is formed between the discharge electrodes 32 and the protective layer 39 with a length or width of 200 to 2000 microns and a height of 10 to 500 microns. The cavity 37 contains the whole discharge electrodes 32 and is filled with a gas selected from at leas one of Argon, Neon, Helium, and Hydrogen, wherein the gas pressure is less than one atmosphere. Because the length or width of cavity 37 is as small as 200 microns, or 0.2 mm, the fabrication of chip-type subminiature electronic device equal to or less than 1.6×0.8 mm (length×width) is feasible.

The two conductive terminals 34 are formed on the side surfaces of the two opposing ends of the substrate 31 and connect with the two ends of discharge electrodes 32 respectively via the two termination pads 36. Terminals 34 are constructed by 3-layer material to function as contact pads when the device is mounted onto circuit boards. The inner layer is silver-containing material or a metallic film that adheres well to the substrate 31 such as pure metal or alloy of titanium and chromium. The middle layer is usually nickel, while the outer layer consists of tin.

Samples of subminiature electronic device according to the preferred embodiment of the invention were fabricated to verify if the specific gas was hermetically sealed inside the cavity. The substrate 31 was made of alumina of 96% purity having a size of 1.6×0.8×0.5 mm (length×width×height). Two discharge electrodes 32 were made of silver spaced apart 50 microns. Also, termination pads 36 and terminals 34 were made of silver-containing material. The cavity 37 has a length of 600 microns, a width of 300 microns, and a height of 50 to 200 microns. The protective layer 39 comprising glass melted in Argon of one atmosphere pressure to seal the cavity 37.

The testing method was to measure breakdown voltage, which was the minimum direct current (DC) voltage that the discharge electrodes 32 started to discharge. The breakdown voltage of the testing samples was measured as 330 volts. For the same samples with the protective layer 39 removed, the measured breakdown voltage was also 330 volts in Argon with a pressure of 300 mmHg but it was 600 volts in atmospheric air (760 mmHg). This test demonstrated that the protective layer 39 of the samples according to the preferred embodiment of the invention hermetically sealed Argon inside the cavity 37 with a pressure of 300 mmHg around.

Figure 4:
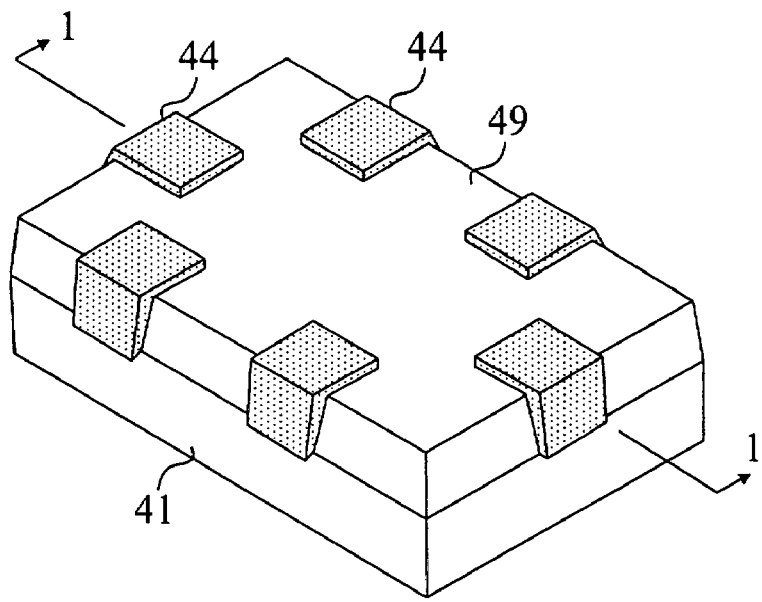
FIG. 4 is a perspective view of a subminiature electronic device according to another preferred embodiment of the present invention with more than two terminals.
Figure 5A:
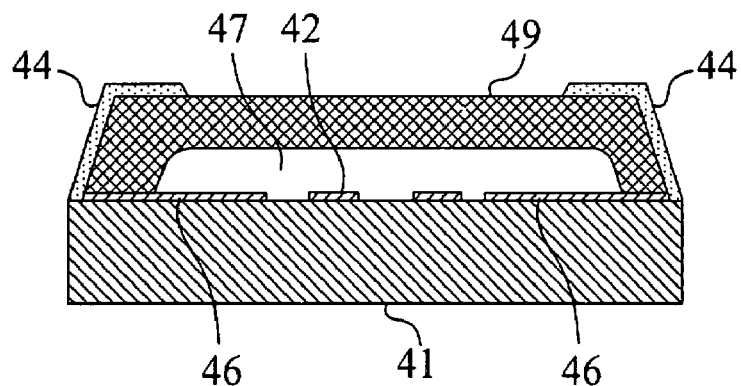
FIG. 5A is a cross-sectional view of FIG. 4 with an electrically insulating substrate.
Figure 5B:
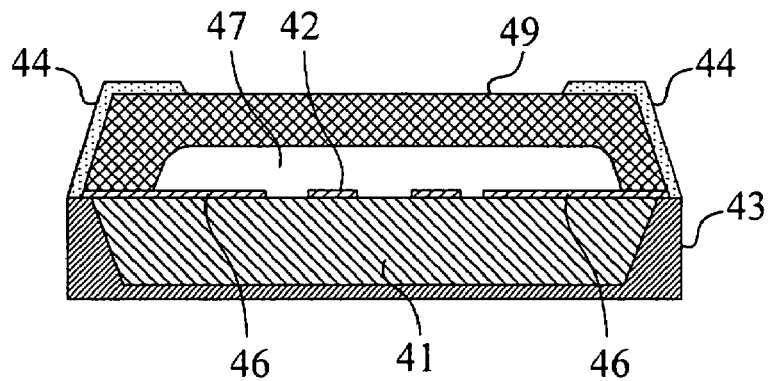
FIG. 5B is a cross-sectional view of FIG. 4 with a semiconducting or conductive substrate.

FIG. 4, FIG. 5A, and FIG. 5B show another example of preferred embodiment of the invention with more than two terminals. FIG. 4 is a perspective view. FIG. 5A and FIG. 5B are cross-sectional views of FIG. 4 along the centerline of width (1-1 line), wherein FIG. 5A illustrates electrically insulating substrates and FIG. 5B illustrates semiconducting or conductive substrates.

This example includes a substrate 41, a protective layer 49, a cavity 47, a microstructure 42, termination pads 46, and terminals 44. Additionally, electrically insulating filler 43 is applied onto the side surfaces and bottom surface of the substrate 41 that is semiconducting or conductive.

Referring to FIG. 5A, the substrate 41 can be made of piezoelectric material such as quartz, lithium tantalite (LiTaO$_3$), lithium niobate (LiNbO$_3$), and so forth, which are electrically insulating and crystalline material with a thickness of 0.2 to 1.0 mm. Piezoelectric material is featured to transfer electrical voltage into mechanical displacement and vice versa. So, piezoelectric material can be utilized in filtering and vibrating components for the conversion between electrical energy and mechanical energy.

Microstructure 42 is disposed onto the top surface of substrate 41. With respect to a surface acoustic wave (SAW) filter, the microstructure 42 includes at least a set of finger electrodes to convert electronic pulse into mechanical vibration on the surface of substrate 41. The mechanical vibration is further converted into another electronic pulse. So, a free space is required over the microstructure 42. The microstructure 42 is usually made of aluminum or an alloy of aluminum and copper, which is deposited by thin film techniques such as sputtering and evaporation. Since the microstructure 42 is very sensitive to moisture, oxidation, and other corrosive gases in atmospheric air, a hermetic cavity 47 is required to ensure that microstructure 42 will function stably for a long time.

More than two termination pads 46 electrically connect microstructure 42 to terminals 44. In general, termination pads 46 are made of aluminum or an alloy of aluminum and copper deposited by thin film techniques such as sputtering and evaporation.

Protective layer 49 comprises glass with a melting temperature between 400 to 600° C. preferably. The protective layer 49 is applied over the microstructure 42 and adheres to the substrate 41, directly or via termination pads 46, around the microstructure 42. The cavity 47 is formed between the microstructure 42 and the protective layer 49 and has a height of 5 to 100 microns. The cavity 47 contains the whole microstructure 42 and is filled with a specific gas of pressure less than one atmosphere. The specific gas often consists of Nitrogen and other additive gases such as Argon, Helium, Hydrogen, and so forth.

Conductive terminals 44 are formed on the surfaces of the protective layer 49 and connect with the microstructure 42 via the termination pads 46 at the end portions of substrate 41. Terminals 44 are generally constructed by 3-layer material to function as contact pads when the device is mounted onto circuit boards. The inner layer is silver-containing material or a metallic film that adheres well to the protective layer 49 such as pure metal or alloy of titanium and chromium. The middle layer is usually copper and nickel while the outer layer consists of tin or gold. Alternatively, the terminals 44 can be formed on the bottom surface of substrate 41.

FIG. 5B depicts another aspect of the example with more than two terminals. The substrate 41 consists of semiconducting or conductive material with a thickness of 0.2 to 1.0 mm, wherein silicon is the most popular choice. The microstructure 42 is disposed on the top surface of substrate 41, including micro electrical-mechanical elements of micro-cantilever beams or membranes. The elements can serve as actuators driven by electric voltage or sensors to detect force, pressure, and acceleration. The microstructure 42 and its peripheral circuits for control and driving are usually fabricated by integrated circuits process. Typically, a thin electrically insulating material is coated onto the microstructure 42 and the top surface of substrate 41 except the predetermined openings.

The protective layer 49, cavity 47, termination pads 46, and terminals 44 illustrated in FIG. 5B are the same as those in FIG. 5A described above. Since the substrate 41 is not electrically insulating, the filler 43 of electrically insulating material is applied onto the side surfaces of substrate 41 to avoid electrical contact with the terminals 44. The filler 43, consisting of epoxy or other thermosetting polymer in general, also covers the bottom surface of substrate 41 as a conformal coating.

FIG. 6 through FIG. 8 and FIG. 9A through FIG. 9C illustrate the manufacturing method of hermetic cavity for the subminiature electronic device of the present invention. Size of the subminiature device is usually very small and a practical method of mass production is to simultaneously process multiple devices on a large substrate. Finally, the large substrate is divided into a plurality of individual devices.

Figure 6:
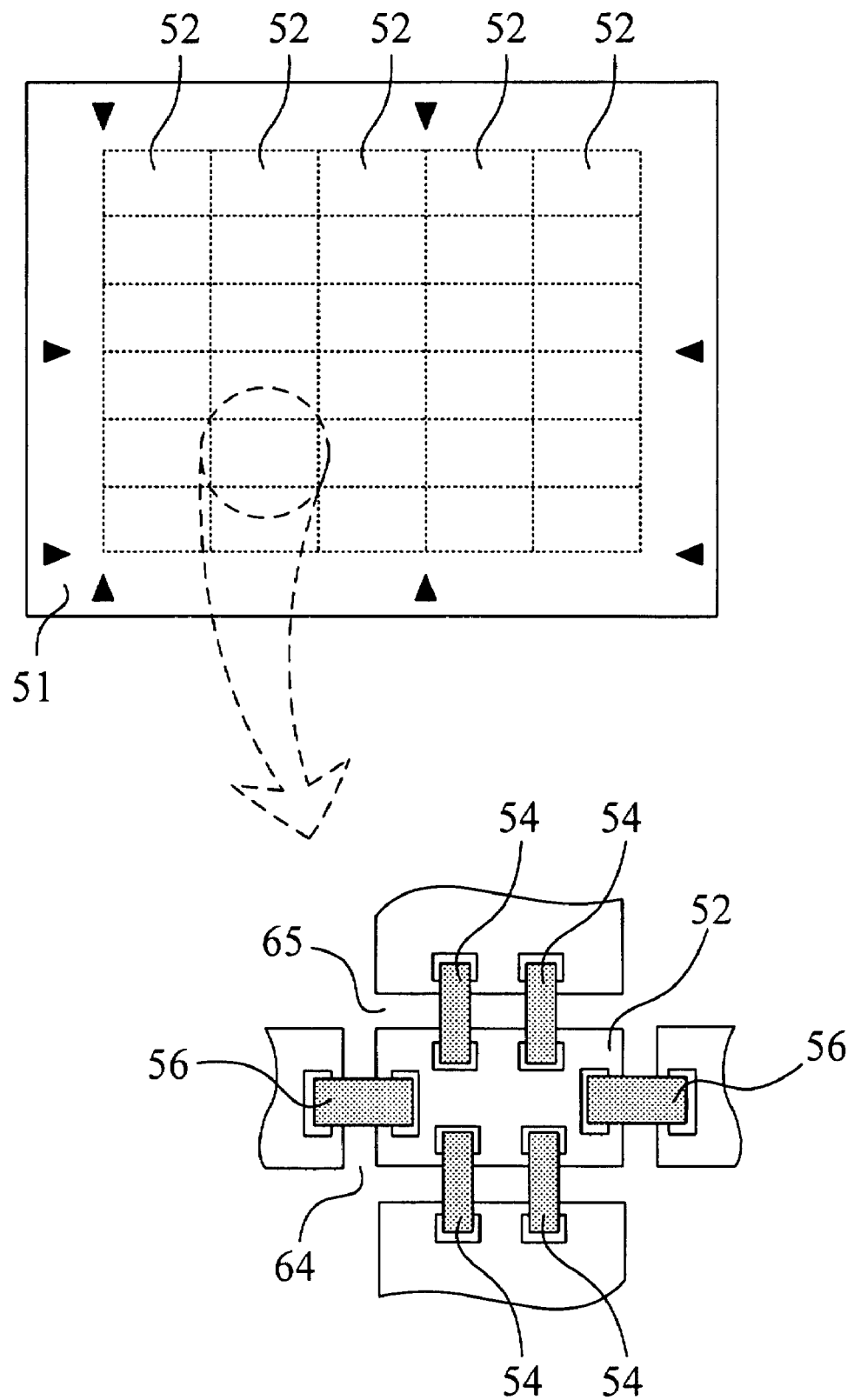
FIG. 6 is a top view of the method for fabricating microstructures and termination pads of the present invention.

Referring to FIG. 6, a large substrate 51 made of electrically insulating materials, semiconducting material, or other materials is provided. The insulating material includes alumina of 96% purity, glass, and so forth. Outline of substrate 51 is usually rectangular with 50 to 150 mm at one side or circular with a diameter up to 200 mm. Therefore, hundreds or thousands of devices can be disposed onto a substrate 51 depending on the size of the device.

A plurality of identical microstructures 52 are disposed onto the top surface of substrate 51. Two adjacent microstructures 52 are spaced at a suitable distance to include the dicing street required for dicing and separation, such as vertical dicing street 64 and horizontal dicing street 65. The width of dicing street is typically 50 to 200 microns. The triangles at the end portions of the substrate 51 serve as aligning marks; the centerline of two triangles in the two opposing ends of the substrate 51 indicates the centerline for dicing and separation.

Termination pads 54 and 56 are metallic films with high electric conductivity that connect microstructures to the dicing streets in vertical and horizontal directions respectively. Termination pads 54 and 56 are often made of aluminum or aluminum/copper alloy deposited by thin film techniques such as sputtering and evaporation. Alternatively, termination pads 54 and 56 can be made of silver-containing material deposited by thick film printing. With respect to the preferred embodiment with two terminals illustrated in FIG. 2 and FIG. 3, only two termination pads 56 in the horizontal direction are required while termination pads 54 in the vertical direction are not needed.

Figure 7:
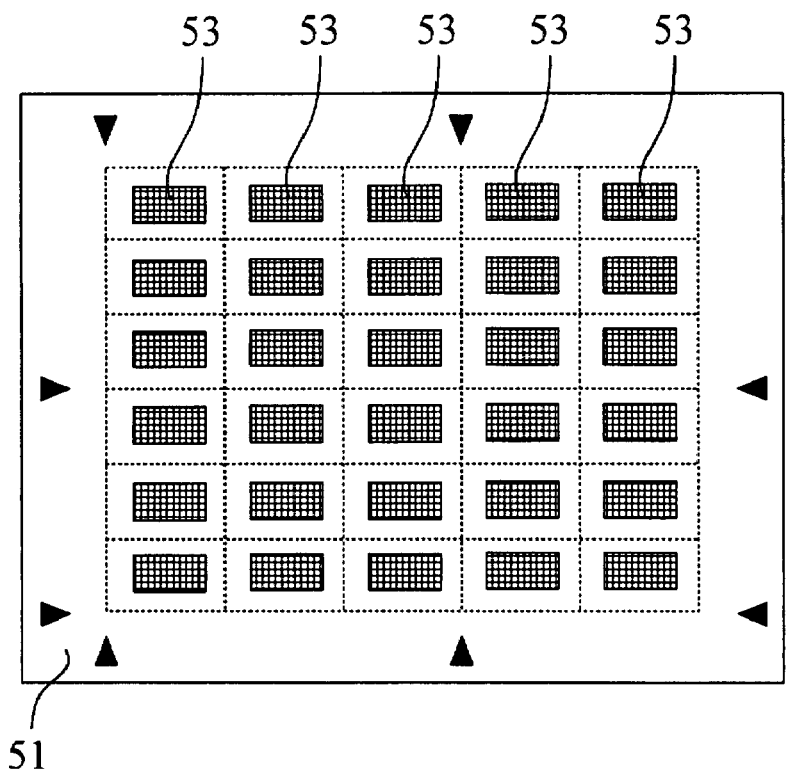
FIG. 7 is a top view of the method for fabricating sacrificial layers of the present invention.

Referring to FIG. 7, a sacrificial layer 53 is formed on each of the microstructures after fabrications of microstructures 52 and termination pads 54 and 56 are completed. The sacrificial layer 53 primarily consists of polymeric resin that is required to shape easily and burn out below 400° C. preferably by reacting with oxygen. Acrylic resin is a good choice that can easily dissolve into Terpineol-based solvent or other suitable solvents to form a viscous paste that is printable by means of screen or stencil.

After removing solvent by drying at 50 to 150° C., the sacrificial layer 53 forms a predetermined shape and size. The thickness can be increased by repeating the printing and drying steps. Alternatively, the sacrificial layers 53 can be formed by means of photo-exposure and development using photoresist polymer or other photosensitive polymer. In this way, the size is fine and precise but fabricating cost is much higher than that of printing.

Figure 8:
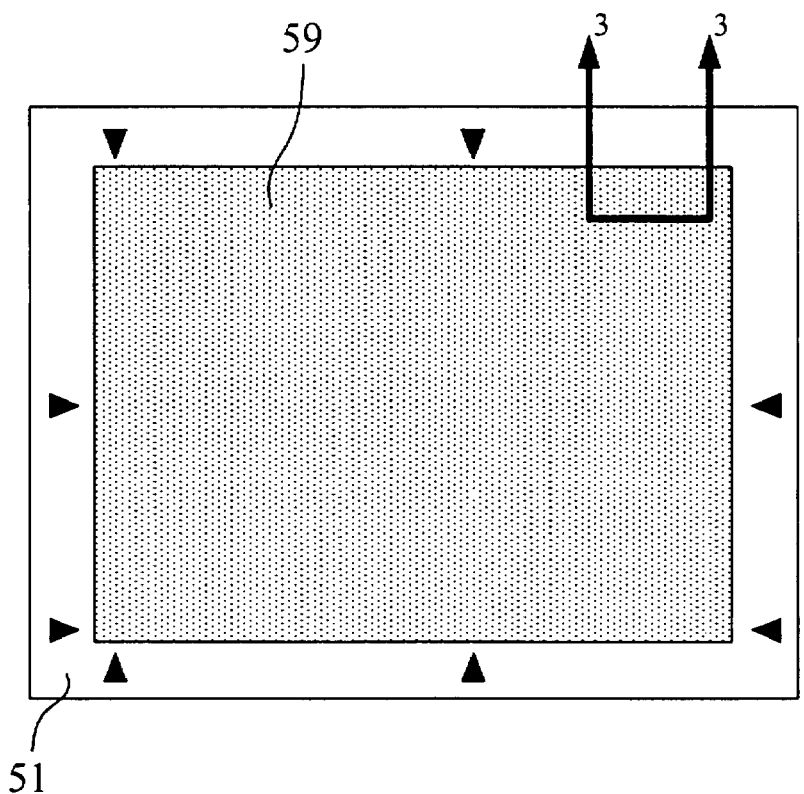
FIG. 8 is a top view of the method for fabricating protective layers and cavities of the present invention.
Figure 9A:
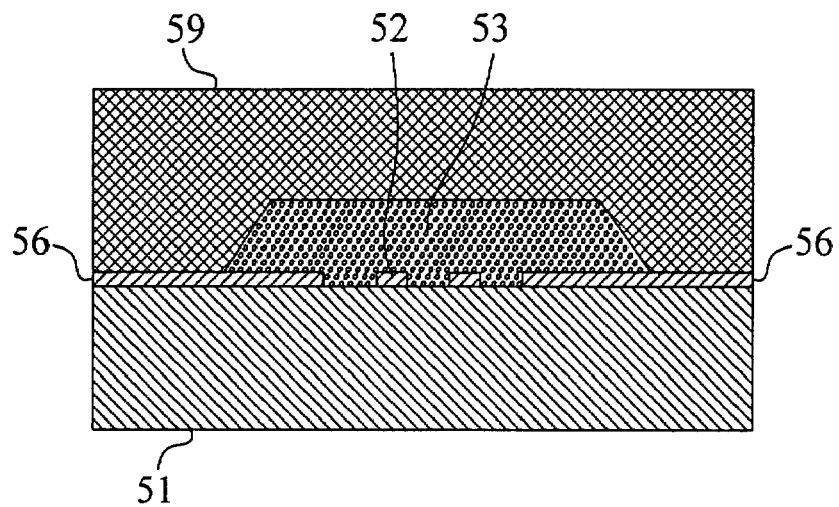
FIGS. 9A, 9B, 9C are cross-sectional views partially taken from FIG. 8 illustrating the steps for fabricating protective layers and cavities of the present invention.
Figure 9B:
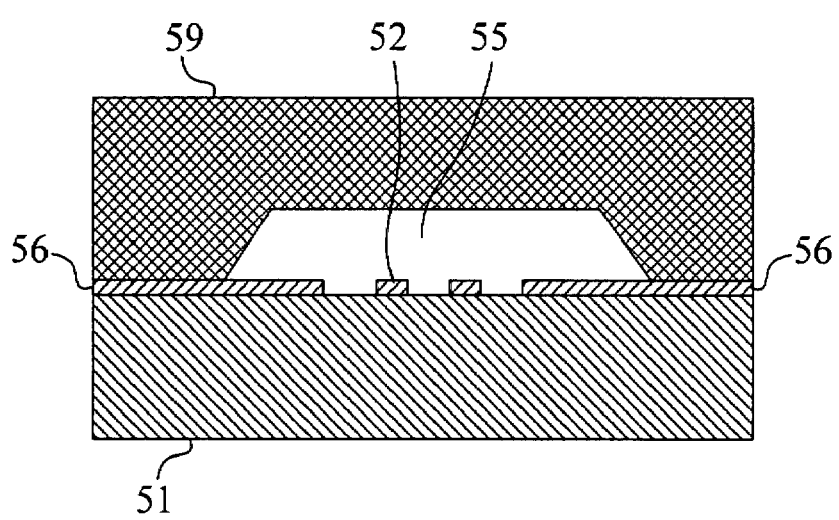
Figure 9C:
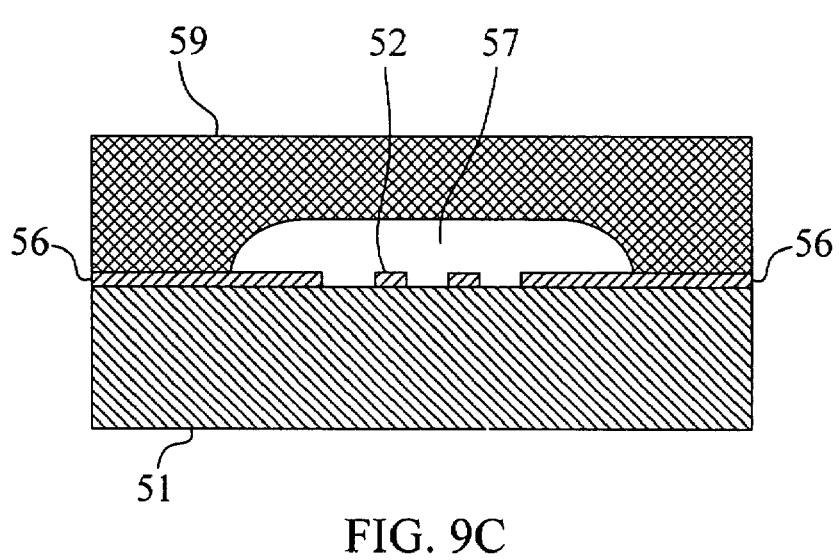

FIG. 8 illustrates the fabricating method of the protective layers 59 and the cavities 57. FIGS. 9A, 9B, and 9C are cross-sectional views taken partially from FIG. 8 along centerline of the microstructures 52 (3-3 line). The protective layers 59 primarily consist of glass that has a melting temperature between 400 to 600° C. preferably. The first step is to print the paste of protective layer 59 made of glass powders, binders, and solvents to encapsulate each sacrificial layer 53 by screen or stencil. The printed paste contacts the substrate, directly or via termination pads 54 and 56, around the sacrificial layer 53.

As illustrated in FIG. 9A, the printed paste is then dried to remove the solvents at 50 to 150° C. to form a predetermined shape and size, which is an assembly of glass powders and binders. The dried thickness can be increased to meet the requirement by repeating the printing and drying steps.

After that, the entire substrate 51 is placed inside a furnace to be heated up by 2 stages. The first stage is to set the temperature at 300 to 400° C. to remove the binders in atmospheric air. Referring to FIG. 9B, the polymeric resin of the sacrificial layer 53 reacts with the oxygen in the air to burn out as carbon dioxide and water vapor. An unsealed cavity 55 thus shapes in the space previously occupied by the sacrificial layer 53. By the way, the binders that bind glass powders of the protective layer 59 also burn out at this stage.

As shown in FIG. 9C, the second stage is to set the temperature at the melting point of the protective layer 59, preferably 400 to 600° C., in the environment of specific gas at a pressure of one or less than one atmosphere. The specific gas includes at least one of Nitrogen, Argon, Neon, Helium, Hydrogen, and other suitable gases as required. Glass powders of the protective layer 59 melt and solidify as a whole to be a dense structure and hermetically seal the cavity 57 after cooling. The height and outline of the cavity 57 will be changed somewhat during the melting process of the protective layer 59.

According to the ideal gas law, the pressure of a gas inside a closed chamber of fixed volume is proportional to the absolute temperature. If the protective layer 59 melts at 400 to 600° C. in 1 atmosphere (760 mmHg), the pressure of the gas enclosed inside the cavity 57 will be less than 1 atmosphere, around 300 mmHg, after cooling down to room temperature.

As mentioned above, the process of melting the protective layer 59 will change the height and outline of the cavity 57. Higher and larger cavity will be subject to more change. For certain device applications that require a higher and larger cavity such as an over-voltage protector for high energy, the cavity 57 can be fabricated by an alternative way. Firstly, metal powders or oxide powders that have higher melting temperature than the protective layer 59, such as copper, nickel, titanium, copper oxide, nickel oxide, and titanium oxide, are added into the sacrificial layer 53. And, the volume of added powders is more than that of the polymeric resin in the remixed sacrificial layer 53.

Referring to FIG. 7 and FIG. 8 again, a sacrificial layer 53 is formed on each of the microstructures 52, and a protective layer 59 follows to encapsulate the sacrificial layer 53. But, there is at least one vent of each sacrificial layer 53 that is not covered by the protective layer 59 so that the sacrificial layer 59 can communicate with the ambient. After that, the entire substrate 51 is heated up by 2 stages to remove the polymeric resin in the sacrificial layer 53 and to melt the protective layer 59 as described above. But, the protective layer 59 may melt in the environment of atmospheric air instead of specific gas and solidify as a whole after cooling. Because the added powders of the sacrificial layer 53 are not melted, the change of sacrificial layer 53 in size is negligible.

Afterwards, the added powders of the sacrificial layer 53 are etched away by suitable chemicals from the at least one vent not covered by the protective layer 59 at a temperature less than 100° C. An unsealed cavity 55 is shaped accordingly in the space previously occupied by the sacrificial layer 53. The paste of sealing plugs, made of glass with a lower melting temperature than protective layer 59, is applied over or in the at least one vent by printing, dispensing or other applicable methods that are well known in the art. Finally, the sealing plugs melt in the environment of specific gas at a pressure of one or less than one atmosphere and solidify to seal the at least one vent after cooling. The hermetic cavity 57 is formed accordingly. The specific gas includes at least one of Nitrogen, Argon, Neon, Helium, Hydrogen, and other suitable gases as required.

Because the sealing plugs may flow onto the microstructure 52 at melting, the at least one vent of sacrificial layer 53 is preferably formed outside the microstructure 52. A practical method of fabrication is to extend the length of each sacrificial layer 53 illustrated in FIG. 7 such that sacrificial layers 53 link together in the horizontal direction. Moreover, the at least one vent not covered by the protective layer 59 is formed over the center of horizontal spacing of two adjacent microstructures 52. Width of the vent is much wider than that of the dicing street. In this way, each sacrificial layer 53 has two vents outside the microstructure 52 to communicate with the ambient.

Such alternative method of fabricating the cavity 57 requires more fabrication steps and the associated cost will be higher. Because the added powders of the sacrificial layer 53 are etched away by suitable chemicals at a temperature less than 100° C., the protective layer 59 and sealing plug may utilize epoxy or other thermosetting polymers for some device applications where hermetic sealing is not required. Glasses and metals solidify simultaneously by melting and cooling process. But, thermosetting polymers solidify simultaneously, near 200° C. in general, by chemical reaction.

Figure 10A:
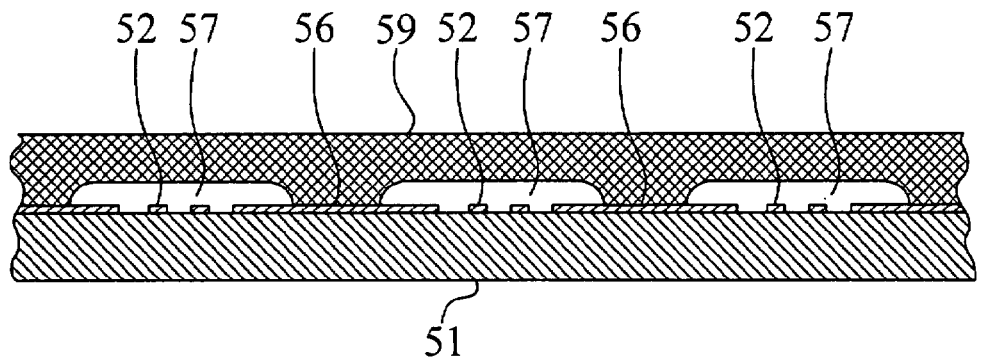
FIGS. 10A, 10B, 10C are cross-sectional views illustrating the precursory steps for fabricating terminals for semiconducting or conductive substrate of the present invention.
Figure 10B:
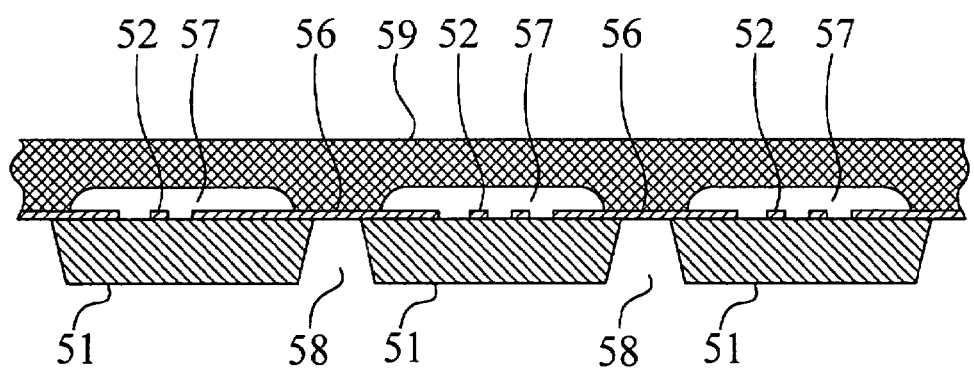
Figure 10C:
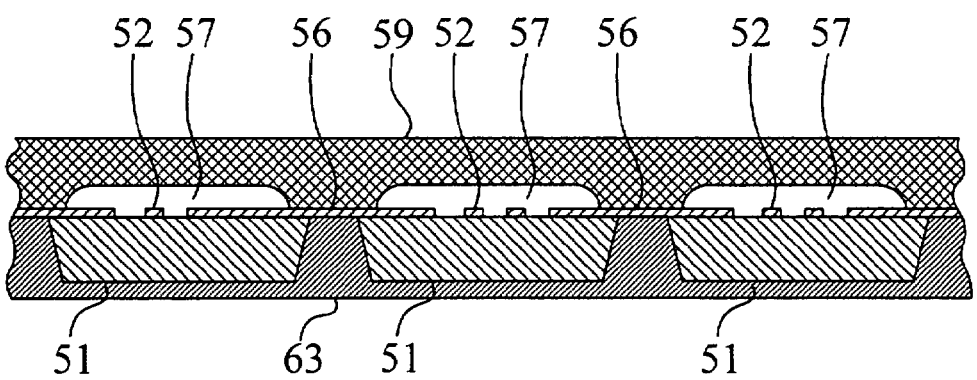

FIGS. 10A, 10B, and 10C illustrate the precursory steps for fabricating terminals of the invention wherein the substrate is not electrically insulating. The electrically insulating filler is applied onto the side surfaces of the substrate to isolate contact between terminals and substrate. As shown in FIG. 10A, the substrate 51 is made of semiconducting or conductive material, wherein silicon is the most popular. The termination pads 56 electrically connect the microstructures 52 to the dicing streets in the horizontal direction. The cavities 57 have been formed and sealed by the protective layers 59.

Referring to FIG. 10B, multiple slots 58 are formed from the substrate 51 beneath the spacing of two adjacent microstructures 52 to isolate the substrates of two adjacent microstructures 52 in both horizontal and vertical directions. The slots 58 are wider than the dicing streets required for dicing and separation. The fabricating method starts from applying photoresist polymer on the bottom surface of the substrate 51 and making narrow openings beneath the spacing of two adjacent microstructures in both horizontal and vertical directions. Then, chemical etching is followed to remove the substrate material from the openings to the termination pads 56. Afterwards, acetone or other applicable solvents are used to strip the photoresist polymer to wrap up the fabrication of slots 58.

Referring to FIG. 10C, electrically insulating filler 63 fills up all slots 58 and coats the bottom surface of the substrate 51 by printing, dispensing, or other suitable means well known in the art. The filler 63 is usually made of epoxy or other thermosetting polymers that solidify near 200° C.

The precursory steps illustrated in FIGS. 10A, 10B, and 10C are not required for the substrate made of electrically insulating materials such as alumina, glass, quartz, lithium tantalite (LiTaO$_3$), lithium niobate (LiNbO$_3$), and so forth.

Figure 11:
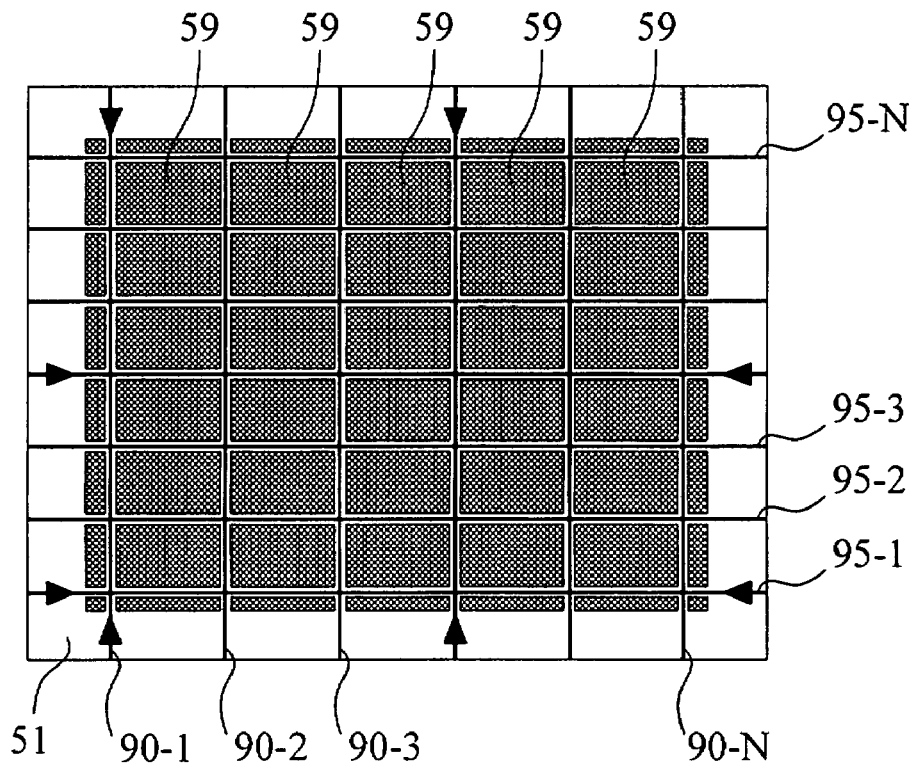
FIG. 11 is a top view of the method for substrate dicing of the present invention.

FIG. 11, FIGS. 12A and 12B, and FIGS. 13A through 13F illustrate the method to fabricate terminals and the method to separate individual subminiature devices from the large substrate. Referring to FIG. 11, the protective layers 59 and the substrate 51 are diced by a diamond blade or laser Parallel lines 95-1, 95-2, - - - 95-N indicate the dicing kerfs in the horizontal direction and pitch of the lines represents the width of individual subminiature device. Parallel lines 90-1, 90-2, - - - 90-N indicate the dicing kerfs in the vertical direction and pitch of the lines represents the length of individual subminiature device.

With respect to the preferred embodiment of the invention with 2 terminals illustrated in FIG. 2 and FIG. 3, dicing starts from the horizontal direction according to parallel lines 95-1, 95-2, - - - 95-N to cut into, but not through, the substrate 51. Dicing in the vertical direction according to parallel lines 90-1, 90-2, - - - 90-N follows to cut through the substrate 51. As a result, the large substrate 51 is divided into a plurality of strips of substrate as shown in FIG. 12A.

Afterwards, the inner layer metal for the terminals 74 is deposited onto the two ends of each strip of substrates by sputtering a metallic film that has good adhesion to the substrate 51 such as pure metal or alloy of titanium and chromium. Alternatively, the inner layer metal can be silver-containing paste deposited by dipping or rolling. Drying and melting follow to form a conductive film containing silver. A middle layer of nickel is then plated onto the inner layer metal. And, an outer layer of tin is plated onto the nickel to complete terminals 74.

Figures 12A, 12B:
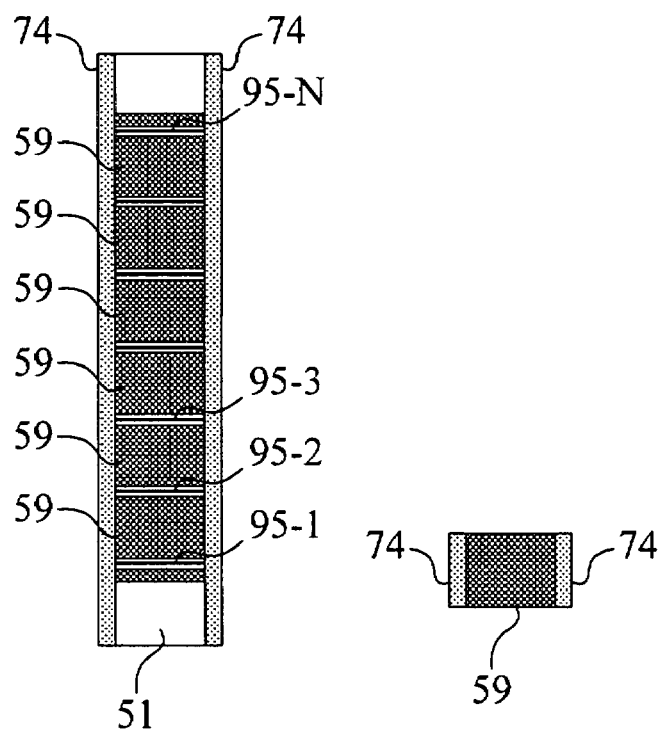
FIGS. 12A, 12B are top views of the method for fabricating terminals and separating individual devices according to a preferred embodiment of the invention with two terminals.

Referring to FIG. 12B, the fabrication of the subminiature device is completed by breaking each strip of substrate into a plurality of individual subminiature devices according to the diced kerfs 95-1, 95-2, - - - 95-N shown in FIG. 12A.

Figure 13A:
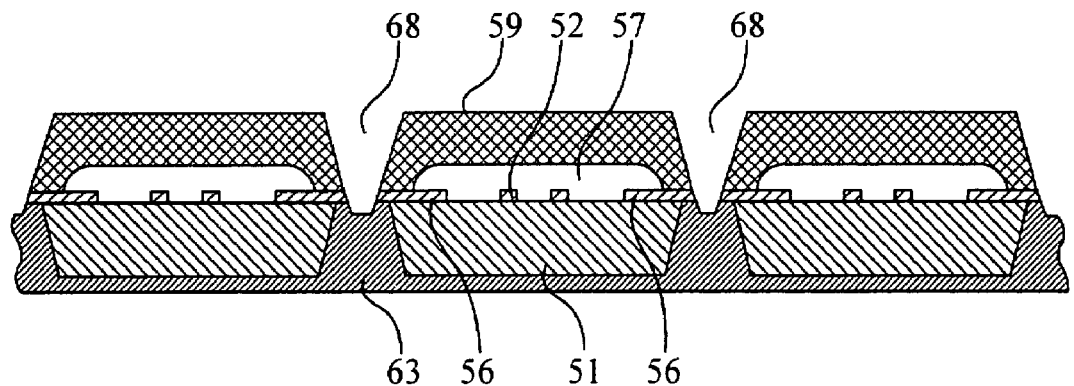
FIGS. 13A through 13F are top views of the method for fabricating terminals and separating individual devices according to another preferred embodiment of the invention with more than two terminals.

Regarding another preferred embodiment of the invention with more than two terminals, the manufacturing steps of terminals are more complicated than that of two terminals. Referring to FIG. 11 and FIG. 13A, dicing in the horizontal and vertical directions cuts into the substrate 51 or the filler 63 slightly. The bottom surfaces and side surfaces of the diced slots 68 must be electrically insulating except the termination pads 56 and 54.

Figure 13B:
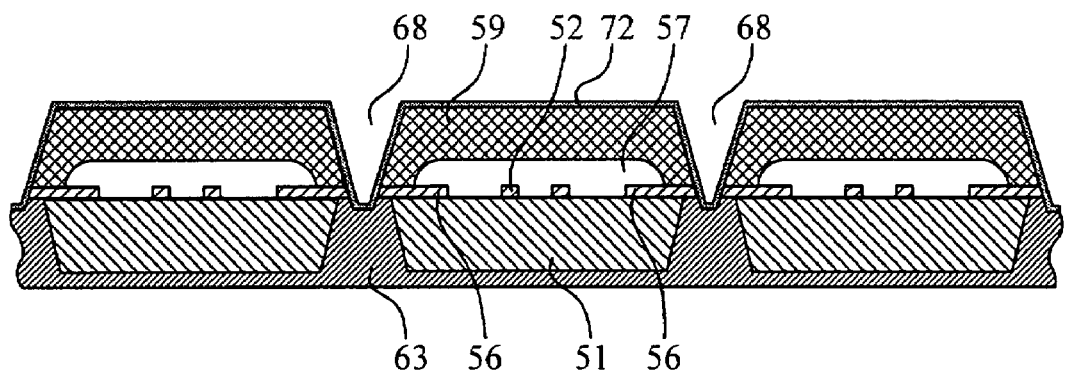

Referring to FIG. 13B, a metallic film 72 is deposited onto the top surface of the protective layer 59 and all surfaces of the diced slots 68. The metallic film 72 has good adhesion to the protective layer 59 and connects with termination pads 56 and 54. The metallic film layer 72 is generally made of pure metal or alloy of titanium and chromium by thin film techniques of sputtering and evaporation.

Figure 13C:
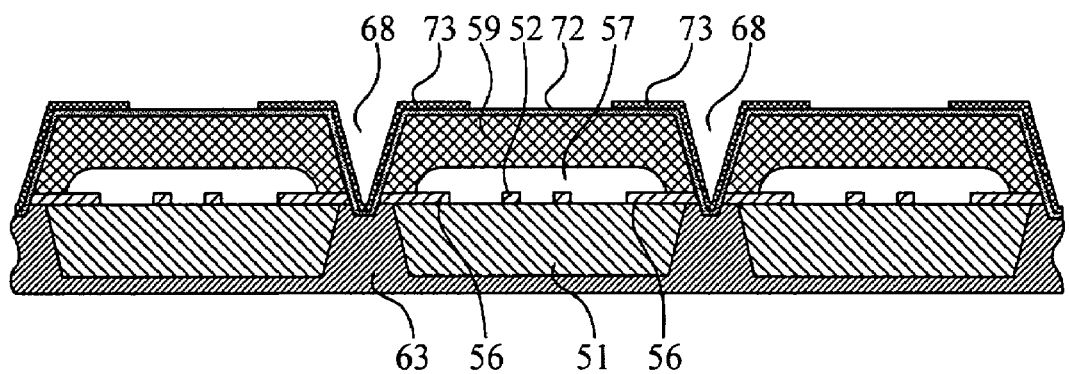
Figure 13D:
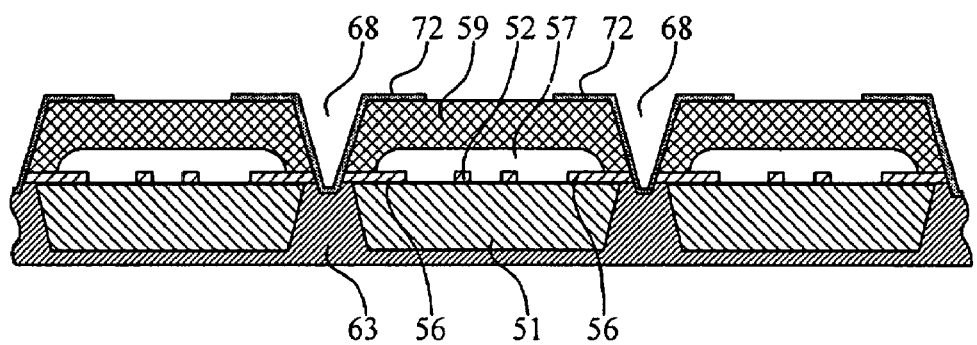

As shown in FIG. 13C, a photoresist polymer 73 of low viscosity is patterned over the metallic film 72 by photo-exposure and development. The metallic film 72 that is not protected by the photoresist polymer 73 is then etched away by suitable chemicals. Referring to FIG. 13D, acetone or other applicable solvents strips the photoresist polymer pattern to reveal the inner layer 72 for terminals.

Figure 13E:
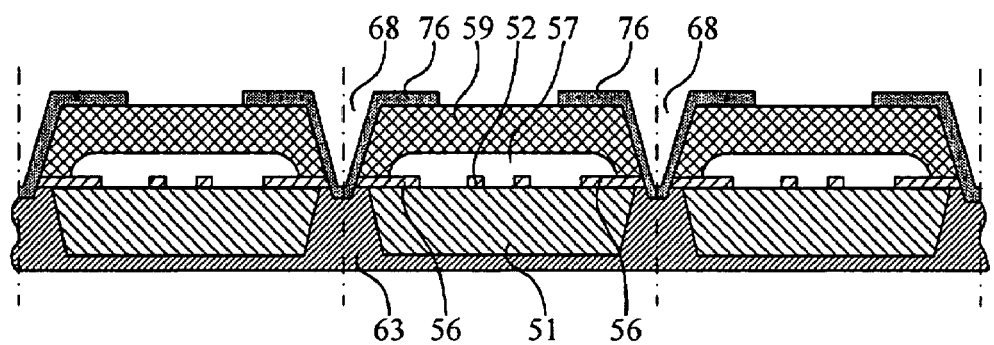

Referring to FIG. 13E, the inner layer 72 is usually very thin, around 0.1 microns or less, so that the resistance is very high. Therefore, the thickness increase of the inner layer 72 by other metals is required to reduce the resistance. A practical method is to deposit a middle layer of copper over the inner layer 72 by plating. Afterwards, a nickel layer is plated over the copper layer and gold or tin is plated as the outer layer to form terminals 76.

Figure 13F:
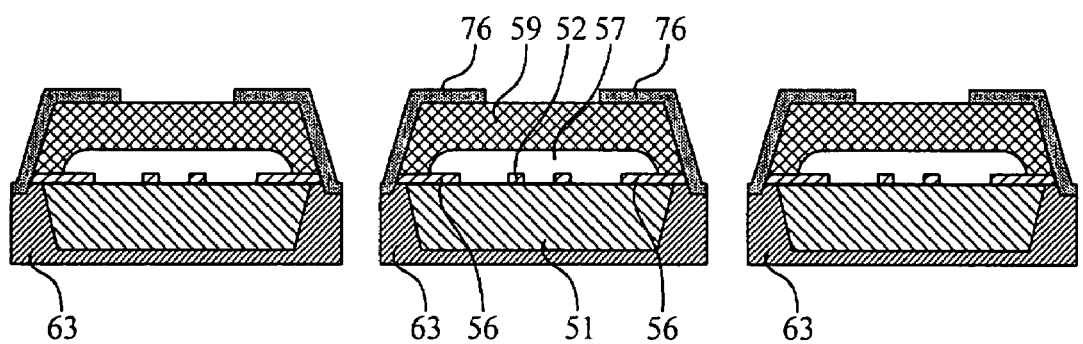

Referring to FIG. 13F, dicing from the bottom surfaces of the slots 68 cuts through the substrate 51 or filler 63 in both horizontal and vertical directions by a diamond blade or laser Individual subminiature devices are finally separated from the large substrate 51, wherein the length and width of the device is the same as that of a chip. A chip scale packaged device with a hermetic cavity is then accomplished in a large substrate level.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A subminiature electronic device with a sealed cavity, comprising:
   a substrate having disposed thereon at least a microstructure;
   a protective layer of homogeneous property formed over said microstructure and adhering to said substrate around said microstructure by melting as a whole, wherein said protective layer is electrically insulating and comprises glass material; and
   a hermetic cavity defined between said microstructure and said protective layer and containing at least a portion of said microstructure.

2. The subminiature electronic device of claim 1, wherein said substrate is composed of hermetic material selected from one of the group consisting of alumina, glass, quartz, lithium tantalate, lithium niobate, and silicon.

3. The subminiature electronic device of claim 1, wherein said microstructure is selected from one of the group consisting of micro-electronic circuits, micro-vibration structures, micro electrical-mechanical structures, and gas discharge structures.

4. The subminiature electronic device of claim 1, wherein at least a portion of said protective layer indirectly adheres to said substrate through at least an intermediate layer.

5. The subminiature electronic device of claim 1, wherein said cavity contains a gas and the pressure of said gas is less than one atmosphere.

6. The subminiature electronic device of claim 5, wherein said gas is selected from at least one of the group consisting of Nitrogen, Argon, Neon, Helium, and Hydrogen.

7. The subminiature electronic device of claim 1, wherein said substrate, said microstructure, and said protective layer form a chip scale package.

8. The subminiature electronic device of claim 7, wherein at least one side surface of said substrate is electrically insulating.

9. The subminiature electronic device of claim 7, further comprising at least a termination pad disposed over said substrate and electrically connecting said microstructure to the end portions of said substrate.

10. The subminiature electronic device of claim 7, further comprising at least a terminal selectively formed on the outer surface of said substrate and said protective layer and electrically connecting said microstructure at the end portions of said substrate.

11. A package of subminiature electronic device, comprising:
  a substrate having disposed thereon at least a microstructure;
  a protective layer of homogeneous property formed over said microstructure and adhering to said substrate around said microstructure by solidifying as a whole;
  a sealed cavity defined between said microstructure and said protective layer and containing at least a portion of said microstructure, said cavity having at least one vent passing through said protective layer; and
  at least a sealing plug sealing said at least one vent of said cavity.

12. The package of claim 11, wherein said protective layer is electrically insulating and comprises glass or polymer material.

13. The package of claim 11, wherein said sealing plug is electrically insulating and comprises glass or polymer material.

14. The package of claim 11, wherein said sealing plug has lower melting temperature than said protective layer, said sealing plug melts in a specific gas environment and solidifies to hermetically seals said specific gas inside said cavity after cooling.

15. A subminiature electronic device with a sealed cavity, comprising:
  a substrate having disposed thereon at least a microstructure;
  a protective layer of homogeneous property formed over said microstructure and adhering to said substrate around said microstructure by melting as a whole; and
  a hermetic cavity defined between said microstructure and said protective layer and containing at least a portion of said microstructure, wherein said cavity contains a gas and the pressure of said gas is less than one atmosphere, and said gas is selected from at least one of the group consisting of Nitrogen, Argon, Neon, Helium, and Hydrogen.

16. A subminiature electronic device with a sealed cavity, comprising:
  a substrate having disposed thereon at least a microstructure;
  a protective layer of homogeneous property formed over said microstructure and adhering to said substrate around said microstructure by melting as a whole; and
  a hermetic cavity defined between said microstructure and said protective layer and containing at least a portion of said microstructure;
  wherein said substrate, said microstructure, and said protective layer form a chip scale package.

* * * * *